(12) United States Patent
Gebhardt

(10) Patent No.: US 11,307,269 B2
(45) Date of Patent: Apr. 19, 2022

(54) MAGNETIC FIELD SENSOR

(71) Applicant: Sensitec GmbH, Lahnau (DE)

(72) Inventor: Carola Gebhardt, Asslar (DE)

(73) Assignee: Sensitec GmbH, Lahnau (DE)

( * ) Notice: Subject to any disclaimer, the term of this patent is extended or adjusted under 35 U.S.C. 154(b) by 46 days.

(21) Appl. No.: 16/767,483

(22) PCT Filed: Nov. 21, 2018

(86) PCT No.: PCT/EP2018/082067
§ 371 (c)(1),
(2) Date: Aug. 4, 2020

(87) PCT Pub. No.: WO2019/110304
PCT Pub. Date: Jun. 13, 2019

(65) Prior Publication Data
US 2021/0003643 A1    Jan. 7, 2021

(30) Foreign Application Priority Data
Dec. 5, 2017   (DE) .......................... 102017128889.9

(51) Int. Cl.
*G01R 33/00* (2006.01)
*G01R 33/09* (2006.01)
(52) U.S. Cl.
CPC ......... *G01R 33/09* (2013.01); *G01R 33/0052* (2013.01); *G01R 33/0076* (2013.01)
(58) Field of Classification Search
CPC ............................ G01R 33/09; G01R 33/0052
See application file for complete search history.

(56) References Cited

U.S. PATENT DOCUMENTS

| | | |
|---|---|---|
| 5,250,925 A | 10/1993 | Shinkle |
| 2003/0071615 A1 | 4/2003 | Schlicker et al. |
| 2011/0089505 A1* | 4/2011 | Schneider ............. G01L 9/0042 257/417 |
| 2013/0119980 A1* | 5/2013 | Ogomi ..................... G07D 7/04 324/252 |

(Continued)

FOREIGN PATENT DOCUMENTS

| | | |
|---|---|---|
| DE | 10164482 A1 | 7/2003 |
| DE | 10308890 A1 | 9/2004 |

(Continued)

OTHER PUBLICATIONS

International Search Report dated Apr. 3, 2019; International Application No. PCT/EP2018/082067.

*Primary Examiner* — Minh Q Phan
(74) *Attorney, Agent, or Firm* — Dinsmore & Shohl LLP

(57) ABSTRACT

A magnetic field sensor for measuring a variable magnetic field, in particular for a movement sensor or position sensor, has a magnetoresistive sensor chip and a flat sensor carrier carrying the sensor chip. The carrier has an upper side from which the sensor chip is electrically contactable, the upper side of the sensor carrier having a recess or depression in which the sensor chip is arranged. The sensor chip is electrically contactable from the upper side and that the sensor chip receives a magnetic field to be measured via an underside of the sensor carrier. A manufacturing method for manufacturing an above magnetic field sensor and a measuring method are proposed.

19 Claims, 3 Drawing Sheets

(56) References Cited

U.S. PATENT DOCUMENTS

2016/0109408 A1\* 4/2016 Decitre .............. G01N 27/9093
                                                                                                    324/238

FOREIGN PATENT DOCUMENTS

| DE | 102011001422 A1 | 9/2012 |
| DE | 102014107262 A1 | 11/2015 |
| DE | 112015003432 T5 | 4/2017 |
| EP | 0324105 A2 | 7/1989 |
| JP | H0694747 A | 4/1994 |

\* cited by examiner

MAGNETIC FIELD SENSOR

CROSS-REFERENCE TO RELATED APPLICATION

This application is the U.S. national stage of PCT/EP2018/082067 filed Nov. 21, 2018, which claims priority of patent application DE 10 2017 128 889.9 filed Dec. 5, 2017. The entire content of each application is incorporated herein by reference.

FIELD OF THE INVENTION

The invention proceeds from a magnetic field sensor for measuring a variable magnetic field, in particular for a movement sensor or position sensor having a very short measuring distance to a sensor surface, so that extremely short distances to the sensor magnet generating the magnetic field are possible.

BACKGROUND OF THE INVENTION

Numerous magnetic field sensor configurations are known from the prior art in which a sensor magnet, which can be both a permanent magnet and a current-excited electromagnet, is moved close to a magnetic field sensor chip, i.e. at distances of less than 5 mm. This is necessary for weak magnetic fields in particular, but also for high-precision sensor applications, for example movement sensors or position sensors.

Due to the construction of previously known magnetic field sensors with a magnetoresistive sensor chip and with a flat sensor carrier holding the sensor chip which is used for electrical contacting, and on which an electronic evaluation unit or connecting elements can be arranged, minimum distances to the sensor magnet of up to 500 µm can be achieved by means of the previously existing chip-on-board (COB) technology. The magnetoresistive sensor chip is in this case fastened directly on the sensor carrier, or is applied to the substrate of the sensor carrier by means of an intermediate carrier. As a rule, a sensor magnet is moved along that surface of the sensor carrier to which the sensor chip has been applied.

Bond pads contacting the electrical components of the sensor chip using bonding wires are typically arranged on the sensor carrier. Due to the bonding system by means of wires and their loop heights, i.e. their structural height, for making the connection between the bond pads and the sensor chip, technological minimum heights result that cannot be fallen short of. For electrical and mechanical protection of the sensor chip on the sensor carrier, a so-called passivation layer is applied over the sensor chip. This is an electronic packaging measure, where embedding of the sensor chip into a synthetic resin jacket or plastic jacket by means of Glob Top technology is used as a rule. In chip-on-board mounting in particular, an epoxy resin is applied to the sensor chip and the bonding wires, to form a mechanically stable outer covering that provides protection from any ambient effects.

Passivation by means of Glob Top can permit maximum structural heights in a magnitude of about 200 µm, however lower minimum heights cannot be achieved. Furthermore, such thin passivation layers on the sensor chip mean that restrictions have to be accepted, in particular with regard to dependability, durability and temperature sensitivity.

If a sensor magnet producing a measuring field is moved over the surface of the sensor carrier in its direct vicinity, it can be passed almost directly above the passivation layer. To prevent any mechanical abrasion in the process, and to form a guide surface for the sensor magnet, a sliding layer can be additionally applied to the Glob Top layer, but this also increases a distance between the surface of the sensor chip and the sensor magnet. Furthermore, electrostatic charging can result from a mechanical brushing movement by the sensor magnet over a surface of the passivation layer, thus increasing ESD (electrostatic discharge) sensitivity, which can cause potential damage to the sensor chip. This is because charging, which can lead to voltage punctures and cause damage to electrical structures on the sensor chip or to the electronic evaluation unit in contact therewith, can result when a sensor magnet is passed very closely over the passivation layer or comes into contact with this passivation layer.

So-called tribological layers, as a rule consisting of plastic and having a friction-reducing effect, have become widespread for use as a surface on the Glob Top passivation layer. These can however become charged under friction contact, and thus not only offer no protection from ESD effects, but even boost them. As a result, only a minimum distance to a sensor magnet of >200 µm is achieved with the existing techniques for constructing a magnetic field sensor, with shorter distances leading to shortening of the service life and/or to proneness to faults.

For example, a magnetic field sensor arrangement is known from the prior art in DE 10 2014 107 262 A1, in which a row of sensor chips is arranged on the edge of a PCB (printed circuit board) to permit measurement of a sensor magnetic field for contactless eddy current testing. It is attempted here with this edge arrangement to move the sensor chip as close as possible to the surface of a workpiece to be measured, however the minimum distances are predetermined by the mechanically protecting passivation layer and by a possible tribological sliding layer, with the result that the sensor sensitivity is limited by the minimum structural distance to the workpiece surface.

DE 10 2011 001 422 A1 relates to a three-dimensional sensor for measurements of magnetic fields. The three sensors are arranged on a substrate consisting of crystalline silicon. A depression having a depth of about 300 µm is made in the substrate. The depression has a plane and side walls, with the sensors being arranged lying flat on the plane for measurement of the magnetic field in the x-axis and in the y-axis. A trench is etched into the depression on one side thereof, inside which a carrier substrate is arranged in a vertical configuration with a third sensor mounted thereon and provided in a cavity of the carrier substrate in order to measure the magnetic field in the z-axis. The third sensor is thus aligned vertical relative to the plane and to the two other sensors. Furthermore, the three sensors are electrically contactable from undersides of the substrate.

DE 101 64 482 A1 shows a device for sensing a magnetic field and a current sensor. A substrate forms a basis for the device, this substrate being designed as a semiconductor substrate, in particular as a silicon substrate. A plastic layer is provided above a passivation layer. A magnetic field sensor is arranged in or on the substrate. Furthermore, the magnetic field sensor can be provided at least partially in a plane with the plastic layer such that at least one plane parallel to the substrate plane intersects both the plastic layer and the magnetic field sensor.

DE 103 08 890 A1 discloses a housing structure for a light-emitting diode and a method for its manufacture. A carrier is provided with a depression consisting of a bottom surface and two side walls. A light-emitting diode is arranged in the depression, with a substrate being provided between the light-emitting diode and the bottom surface. Furthermore, the depression can have a depth as such of 10 mm. This permits better transmission through the light-emitting diode.

SUMMARY OF THE INVENTION

Proceeding from the above prior art, the object of the present invention is to propose a magnetic field sensor providing a very short distance to a sensor magnet in a magnitude of <200 µm, in particular in a magnitude of 100 µm to 30 µm.

This object is achieved by a magnetic field sensor, a manufacturing method and a measuring method as disclosed herein.

Advantageous embodiments of the invention are also disclosed.

The invention proceeds from a magnetic field sensor for measuring a variable magnetic field, in particular for a movement sensor or position sensor, comprising a magnetoresistive sensor chip and a flat sensor carrier carrying the sensor chip and having an upper side and an underside, the upper side of the sensor carrier having a recess or depression in which the sensor chip is arranged.

It is proposed that the sensor chip is electrically contactable from the upper side and that the sensor chip receives a magnetic field to be measured via an underside.

In other words, the invention relates to a magnetic field sensor comprising a magnetoresistive sensor chip, said sensor chip being formed on a flat sensor carrier, for example a PCB, a semiconductor substrate or a flat receptacle of the sensor chip designed in another way. The sensor chip is held in the sensor carrier and is electrically contactable to bond pads of the sensor carrier, for example by bonding wires. The sensor chip is designed to receive a sensor magnetic field of a sensor magnet which acts on the magnetic field sensor from an underside of the sensor carrier. The sensor chip is contactable from the upper side of the sensor carrier and is as a rule positioned on and fastened to the sensor carrier from the upper side. To provide an extremely short distance to the sensor magnet a recess or depression, inside which the sensor chip is arranged and fastened, is provided from the upper side of the sensor carrier.

A recess, as used in the invention, means a penetration through the sensor carrier such that the latter has to a certain extent a hole in which the sensor chip is inserted and is embedded inside the hole, for example by means of a packaging method, for example a passivation layer by means of Glob Top, and fastened in the sensor carrier. Alternatively, the sensor carrier can have a depression, i.e. a region having a limited surface area with a lower thickness of the sensor carrier, inside which the sensor chip is held and fastened such that inside this depression the magnetoresistive sensor chip can be arranged closer to the sensor magnet brushing past it on the underside.

In an advantageous embodiment, the sensor chip can be positioned on and fastened to the sensor carrier from the upper side. This allows an extremely short distance to the sensor magnet to be provided.

In an advantageous embodiment, the underside of the sensor carrier can be coated with a carrier film and/or with a tribological protective layer, said carrier film being preferably a Kapton film. A carrier film can be used temporarily in particular during the course of the manufacturing process, to be affixed to the underside of the sensor carrier in the event that said sensor carrier has a recess, so that the sensor chip can be positioned on the Kapton film and thereafter electrically connected to contacting means of the sensor carrier and then passivated, in particular embedded by means of Glob Top. After that, the Kapton film can remain on the underside, while defining a minimum distance to the sensor magnet, or it can be removed, so that a very short distance between sensor chip and sensor magnet can be achieved.

Alternatively or additionally, a tribological protective layer can be applied to the underside in the area where the sensor chip is placed on the substrate carrier. The tribological protective layer can be a plastic layer preventing mechanical abrasion and offering an increased sliding capacity, so that a sensor magnet can be moved along the underside of the substrate carrier or along the underside of the sensor chip while in mechanical contact therewith, without mechanical damage and with reduced friction coefficient. The tribological layer can have a thickness of 10 µm or less. The sensor chip is held and fastened in the recess or in the depression of the substrate carrier such that its contactable surface, which is put in contact with bond pads on the substrate carrier by means of bonding wires, faces in the direction of the upper side of the substrate carrier.

In an advantageous embodiment of the magnetic field sensor, the depression on the underside of the sensor carrier can be limited by a thin wall area formed with a wall thickness of less than 100 µm, in particular less than 50 µm and preferably less than 30 µm. It is for example thus possible that the substrate carrier undergoes abrasive grinding in the area in which the sensor chip is arranged, i.e. material is removed by means of an abrasive process, thereby creating a depression. Alternatively, it is conceivable to build up the substrate carrier by an additive manufacturing method, for example a 3D printing method, while leaving a minimum possible wall thickness of the substrate carrier at that location. This permits maximum mechanical protection and the use of existing connection technologies and process methods during manufacture of the magnetic field sensor.

For a further reduction of the distance, the lower substrate side of the sensor chip can also be reduced prior to being fastened on the sensor carrier, e.g. by grinding, in order to provide a thin chip substrate such that the magnetoresistive layers of the sensor chip that are arranged on the surface of the substrate can be closer to the underside of the sensor carrier.

In an advantageous development, the recess or depression can be designed step-like and can have a deepened connection area holding the bond pads, the bonding wires preferably being laid inside the recess or depression such that they do not protrude above the upper side of the sensor carrier. In this embodiment, it is proposed to form a step-like deepened connection area of the bond pads on the substrate carrier, where bonding wires connect the bond pads of the substrate carrier to the chip between the deepened connection area and the sensor chip positioned even deeper inside the substrate carrier. The bonding wires can be advantageously laid such that they do not protrude above the surface height of the substrate carrier, so that the sensor chip is embedded in the substrate carrier such that there is no projection of the bonding wires on the upper side of the substrate carrier surfaces. This allows ultra-thin substrate carriers to be manufactured in which the sensor chip is practically embedded in the interior and there is no projection on either the underside or the upper side of the substrate carrier. The deepened connection area can be designed in any size, and can in particular provide space for six bond pads to permit contact with two Wheatstone bridges for a 2D vector sensor formed by the magnetoresistive resistors of the sensor chip. The deepened connection area can be formed on one, two or three sides adjoining the sensor chip, to permit the most space-saving contact possible of the sensor chip.

In an advantageous embodiment, the recess or depression can be filled in and/or covered with a protective jacket ending plane with the surface or protruding above the upper side, said protective jacket preferably being a Glob Top protective jacket. The protective jacket is used for passivation and is as a rule formed by a synthetic resin or epoxy resin, Glob Top passivation being achievable which is either flush with the surface of the sensor carrier or protrudes in overlapping manner beyond the depression or recess area of the sensor carrier, in order to achieve mechanical stabilization and also passivation of the sensor chip. In particular when a deepened connection area is provided in the sensor carrier, the upper side of the sensor carrier can be filled to be plane with the protective jacket, to permit an ultra-thin design of the magnetic field sensor.

In a preferred embodiment, the sensor chip can comprise a carrier substrate ending which ends flush with the underside of the sensor carrier and/or is arranged on a thin wall area separated from the underside of the sensor carrier, and the thickness of the carrier substrate can be formed to be less than 100 µm, in particular less than 50 µm and preferably less than 30 µm. The sensor carrier can thus have a recess or a depression on which the sensor chip is either aligned flush with the underside of the sensor carrier or is mounted on a thin wall area having a thickness of less than 100 µm, less than 50 µm or less than 30 µm. As a result, minimum distances to the sensor magnet of 100 µm or less can be achieved, and a high degree of mechanical protection and a defined arrangement surface for the sensor chip can be provided.

In a preferred embodiment, a sensor magnet generating a sensor magnetic field can be movable along the underside of the sensor carrier, with a tribological protective layer being applied preferably to the underside of the sensor carrier as mechanical protection, both reducing the friction coefficient and providing mechanical protection for the underside of the sensor chip or of the thin wall, so that a long service life with a minimum distance to the sensor can be achieved.

In a subordinate aspect, a manufacturing method for manufacturing a magnetic field sensor is proposed and comprises the following steps:
  creation of a recess or depression extending from the upper side of the sensor carrier towards the underside of the sensor carrier
  at least temporary fastening of a sensor chip in the recess or depression in the area of the underside of the sensor carrier
  bonding of the sensor chip for electrical contacting to bond pads of the sensor carrier
  at least partial embedding of the sensor chip in the recess or depression inside a protective jacket for passivation.

In other words, a manufacturing method is proposed in which a recess is manufactured in a substrate carrier, for example in a PCB or in a chip substrate or in any other flat carrier, i.e. a through-hole or a depression, i.e. an area with a thinned wall thickness in the direction of the underside of the substrate carrier inside which the sensor chip is fastened at least temporarily, for example by affixing it to a carrier film, in particular a Kapton film, or by mechanical clamping. The sensor chip is then connected to electrical contacts of the sensor carrier, in particular connected by means of bonding wires to bond pads of the sensor carrier, and the sensor chip is finally passivated, i.e. embedded into an epoxy resin, plastic or the like and hence mechanically and electrically protected from the outside.

In an advantageous development of the manufacturing method, the sensor chip can be positioned on and fixed to a carrier film, in particular a Kapton film, at least temporarily attached to the underside of the sensor carrier for at least temporary fastening. The Kapton film can be applied self-adhesively to the underside of the substrate carrier, and the sensor chip can be placed on the Kapton film of the recess, then electrically connected and subsequently embedded. The Kapton film can be peeled off at the end of the manufacturing method, so that the underside of the sensor chip is aligned with the underside of the sensor carrier, or the Kapton film can remain on the underside for extended mechanical protection, and/or be provided with a tribological protective layer.

In an advantageous development of the manufacturing method, the sensor carrier can be manufactured by an additive manufacturing method, for example in a 3-D printing method, where a thin wall area of the underside of the sensor carrier is preferably formed with a wall thickness of less than 100 µm, in particular less than 50 µm and preferably less than 30 µm inside the depression. This embodiment is proposed for the manufacture of a thin wall area, which when seen from the surface forms a depression, inside the sensor carrier using an additive manufacturing method, where at least some areas of the sensor carrier are manufactured additively, and using the additive manufacturing method, for example a 3-D printing method, an extremely thin wall area can be built up in which the sensor carrier can be arranged and mechanically protected against the underside of the sensor carrier. In this method, it is very simple to provide a deepened connection area in the sensor carrier, so that bonding wires in the connection area and having a structural height no higher than the surface of the substrate carrier can contact the sensor chip such that an extremely thin embodiment of the sensor carrier is possible in which the sensor chip with its electrical contacting is practically buried inside the sensor carrier.

In an advantageous further example of the manufacturing method, a tribological protective layer can be applied to the underside of the sensor carrier. The tribological protective layer can cover both the underside of the sensor carrier and the recess area or the thinned wall area of the sensor carrier, and can permit a contacting movement of the sensor magnet on the underside of the sensor carrier in which an extremely short distance can be achieved between the sensor magnet and the sensor chip with the lowest possible friction coefficient and low mechanical abrasion.

In an advantageous development of the manufacturing method, the underside of the sensor carrier can be ground flat at least in the area around the recess after embedding of the sensor chip. In particular when a recess is provided in the substrate carrier, the sensor chip is embedded, where the passivation material can project out of the recess and beyond the surface of the underside of the sensor carrier. In this case, it is appropriate to grind flat the underside of the sensor carrier plan, also to reduce the minimum distance to the sensor chip, which can lead to the lowest possible distances from the sensor magnet being achieved even when a depression is provided inside the sensor carrier.

The underside too of the sensor chip can be sanded or ground down to reduce its substrate thickness, so that the distance between the substrate surface carrying magnetoresistive structures and the underside of the sensor carrier can be further reduced.

In an advantageous development of the manufacturing method, the recess or depression can be designed step-like inside the carrier substrate in order to provide a deepened connection area on which bond pads can be arranged, with the bonding wires preferably being laid inside the recess or depression during bonding such that they do not protrude above the surface of the sensor carrier. By providing a connection area of step-like design along one, two or three sides of the depression area or recess area in which the sensor chip is arranged, an extremely thin design of the sensor carrier and of the entire magnetic field sensor can be achieved, with the sensor chip being practically embedded inside the structural depth of the sensor carrier and not projecting beyond it. This can be advantageously exploited in particular for applications with extremely low structural heights for magnetic field measurement.

In a further subordinate aspect, a measuring method making use of a magnetic field sensor, as described above, is proposed, where a sensor magnet is moved along the underside of the sensor carrier, and the measurement signals of the sensor chip are processed and/or evaluated by an evaluation device arranged on the upper side of the sensor carrier. Hence a complete system of a magnetic field sensor is proposed, where in the measuring method the sensor magnet is moved directly or only at a short distance to the underside of the sensor carrier, and the measurement signals of the magnetoresistive sensor chip are evaluated on a evaluation device installed on the upper side of the sensor carrier. A very compact measuring method and a compact magnetic field sensor can therefore be provided.

BRIEF DESCRIPTION OF THE DRAWINGS

Further advantages emerge from the following drawing description. The drawing shows examples of the invention. The drawing, the description and the claims contain many features in combination. The person skilled in the art will also consider the features individually, and combine them into useful further combinations.

FIG. 3b is a plan view onto an upper side of the magnetic field sensor of FIG. 3a;

In the figures, identical or similar components have the same reference numerals. The figures show only examples and must not be understood as limiting.

DETAILED DESCRIPTION OF THE INVENTION

Figure 1A:
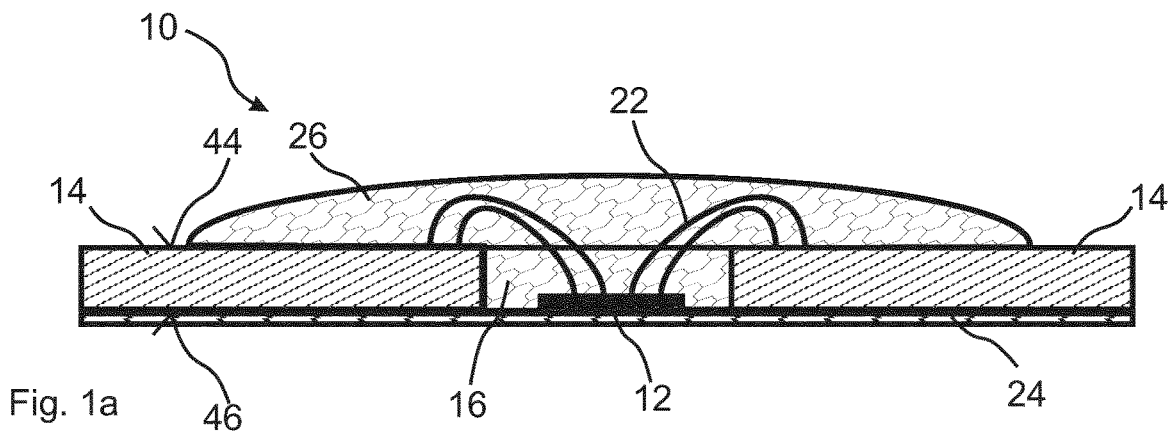
FIGS. 1a and 1b are views of a first embodiment of a magnetic field sensor, in a cross-section and in a plan view onto the upper side of the sensor carrier.
Figure 1B:
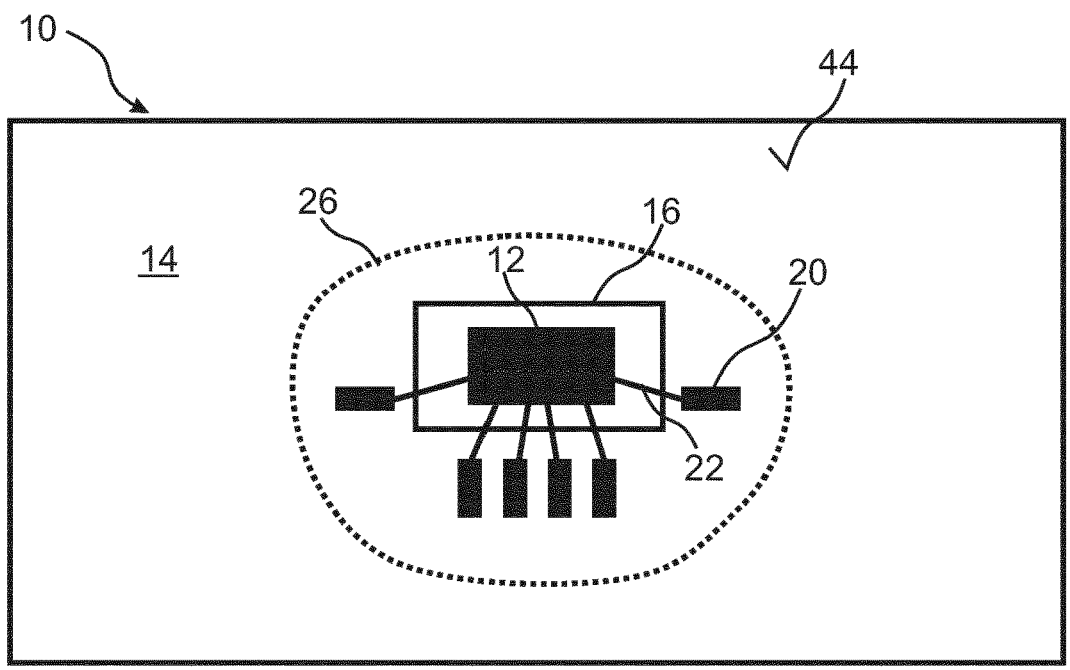

FIGS. 1a and 1b show a first example 10 of a magnetic field sensor according to the invention. FIG. 1a shows a cross-section and FIG. 1b a plan view onto a sensor carrier 14 embedding a sensor chip 12. The sensor carrier 14 can be designed as a PCB (printed circuit board) or as a chip substrate. The sensor chip 12 can be designed as a magnetoresistive sensor chip, in particular as a magnetoresistive Wheatstone bridge circuit for determining one or more vector components of a magnetic field and which is able to measure direction-sensitively or omnidirectionally at least one component of a magnetic field in the direct vicinity and to determine its size. The sensor chip can be based on a HALL, AMR, GMR, TMR or other magnetoresistive technology.

Further electrical connections, not shown, are arranged on the sensor carrier 14 for voltage supply and for pickup of sensor values. Electrical contacting between the sensor chip 12 and the sensor carrier 14 is achieved by bonding wires 22 connecting connection points on the sensor chip 12 to bond pads 20 on the sensor carrier 14. Further electrical connections, not shown, to an external electronic evaluation unit extending from the bond pads 20 are provided. For example, for one 2D sensor two bond pads 20 can be provided for voltage supply and four further bond pads for pickup of sensor values for an X-sensitive and a Y-sensitive magnetic field component in the plane of the sensor carrier, which are measurable by two Wheatstone bridges rotated by 90° on the sensor chip 12, in order to determine a magnetic field component directed in the plane of the sensor carrier 14 depending on the direction. From this, it is for example possible by an arc tangent operation to determine an angle of a magnetic field in the plane of the sensor carrier 14.

The sensor chip 12 is arranged in a recess 16 of the sensor carrier. The recess can be shaped as a circular hole or, as shown in this example, as a rectangular hole in the sensor carrier 14. The recess 16 can also have the form of a slot, for example in order to record over a predefined length a magnetic field component in the form of a line scanner.

For protection of the sensor chip 12, the bonding wires 22 and the bond pads 20, the recess and an area above it on the surface of the sensor carrier 14 are provided with a protective jacket 26, for example an epoxy resin, by means of Glob Top passivation. A carrier film 24, for example a Kapton film, is applied to the underside of the sensor carrier 14, on which the sensor chip 12 is placed and fastened at least temporarily during mounting, and which subsequently acts as a protective layer against mechanical wear and helps reduce sliding friction of a sensor magnet for example by means of tribological properties. The thickness of the carrier film 24 determines at the same time the minimum distance between the sensor chip 12 and a sensor magnet, not shown in this example.

Figure 2:
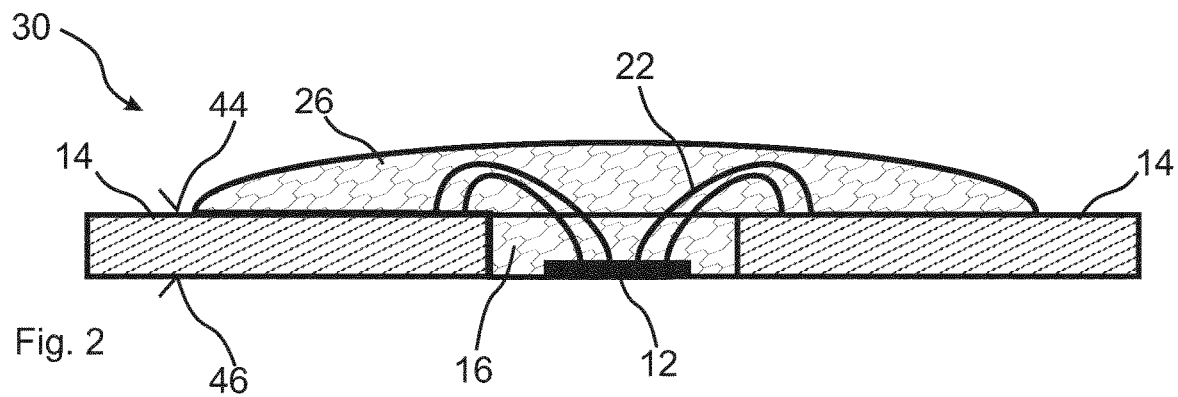
FIG. 2 is a cross-section view through a further embodiment of a magnetic field sensor.

FIG. 2 shows, correspondingly to the embodiment of FIG. 1, a further example 30 of a magnetic field sensor. This corresponds substantially to the construction of the example 10 in FIGS. 1a, 1b. However a carrier film 24 is provided on the underside 46 of the sensor carrier. Said film can be attached for a short period in the manufacturing process in order to fasten the sensor chip 12 temporarily, to provide the electrical wiring by means of bonding wires 22 to the sensor carrier 14, and then to be removed. The sensor chip 12 is therefore embedded in the recess 16 only by the protective jacket 26, and is practically open in the direction of the underside of the sensor carrier 14 or is only protected by a wafer-thin Glob Top layer. As a result, an extremely minimal distance to a sensor magnet of a few micrometers is possible.

Figure 3A:
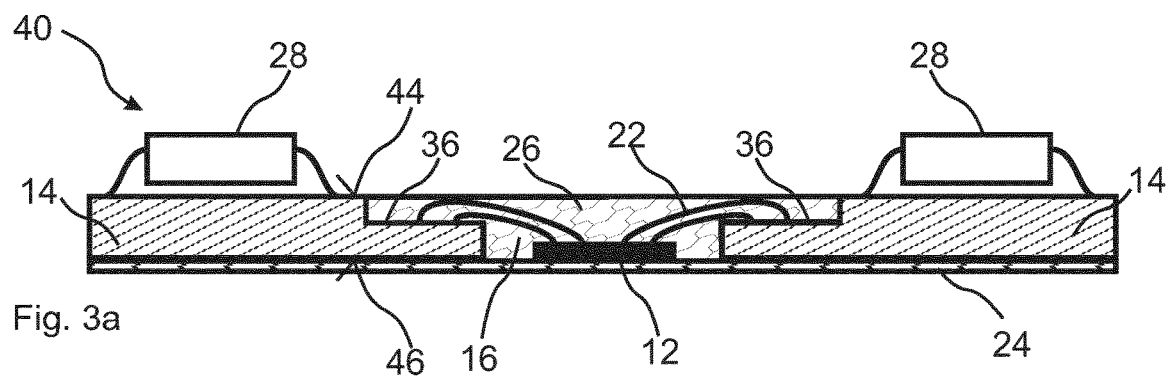
FIG. 3a is a sectional representation in a plan view onto an upper side of a magnetic field sensor of a further embodiment of the invention.
Figure 3B:
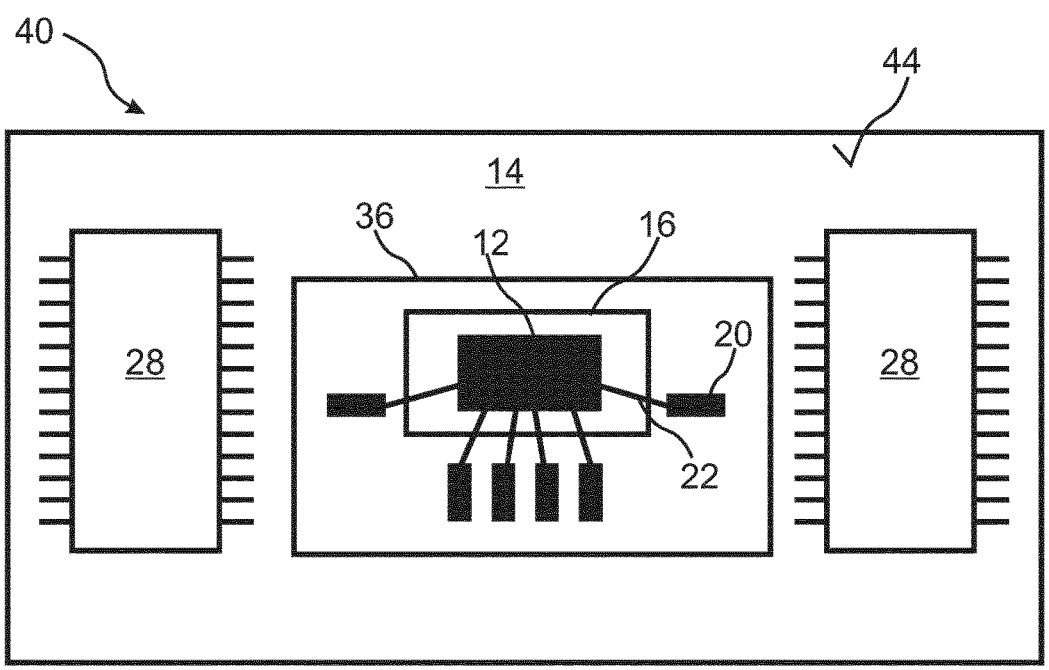

FIGS. 3a, 3b show a further example 40 of a magnetic field sensor. FIG. 3a shows a section, and FIG. 3b a plan view onto the sensor carrier 14 with the embedded sensor chip 12. Unlike in the embodiments 10, 30 shown in FIGS.

1a, 1b and 2, in this embodiment 40 a step-like deepened connection area 36 is provided in the recess 16, which is offset downwards in a step relative to the level of the upper side 44 of the sensor carrier and on which pads 20 are arranged. Bonding wires 22 connect electrical connection points of the sensor chip 12 to the bond pads 20 on the deepened connection area 36 of the sensor carrier 14. This makes it possible, by careful laying of the bonding wires 22, to provide a structural height both of the sensor chip 12 and of the electrical connection to the bond pads 20 that does not project beyond the upper side 44 of the sensor carrier 14. Passivation by means of a protective jacket 26, for example Glob Top, fills up both the step-like connection area 36 and the recess 16, and thus encloses the sensor chip 12 at least from the upper side and the side areas, and also the bond pads 20 and bonding wires 22.

In the embodiment 40, a magnetic field sensor can be created by means of the deepened connection area 36, where the entire sensor chip 12 with wiring attains a structural height which extends no higher than the upper side 44 of the sensor carrier 14. This allows an extremely thin-walled magnetic field support to be achieved which can be used in particular for measuring work in areas with restricted space. The example here shows an external circuit on the sensor carrier 14 by means of electronic elements 28, which can have an electrical connection to the bond pads 20.

In the example 40, similarly to the example 10, a carrier film 24 is applied to the underside 46 of the sensor carrier 14 and can have tribological properties and provides protection for the underside of the sensor chip 12 embedded from the upper side and from the lateral sides.

Figure 4:
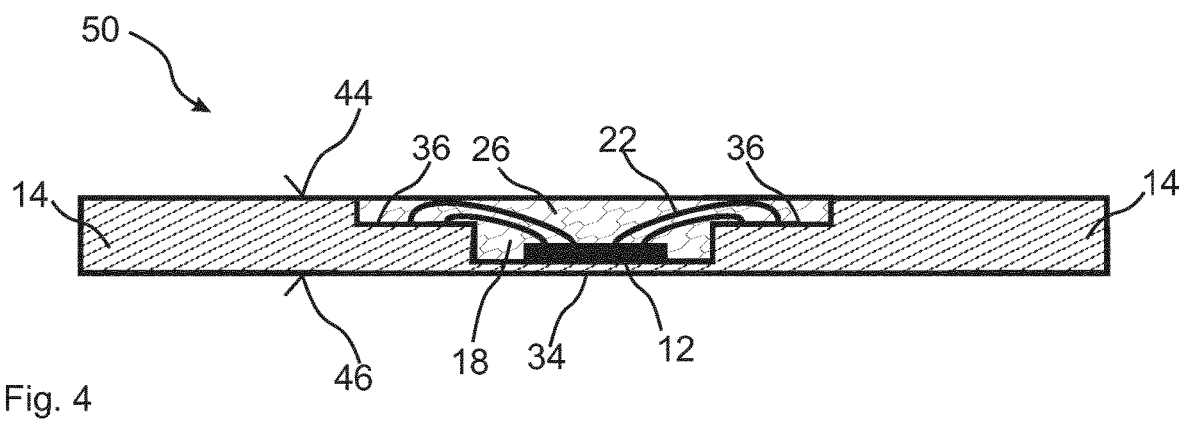
FIG. 4 is a cross-section of a magnetic field sensor of a further embodiment of the invention.

FIG. 4 shows similarly to FIG. 2 a further example 50 of a magnetic field sensor, which follows in its construction the example 40, and likewise has a deepened connection area 36. Unlike in the preceding examples, however, the magnetic field sensor 50 has no recess 16, but a depression 18 in the sensor carrier, so that a thin wall area 34 in the sensor carrier limits the underside of the depression 18. The width of this thin wall area of the sensor carrier 14 thus determines a minimum distance to a sensor magnet and acts as the rest surface of the sensor chip 12. The sensor chip 12 is placed onto this thin wall area 34 during manufacture, and bonding wires 22 put it into contact with bond pads 20 in the deepened connection area 36. Here too, this depression 18 is filled by means of Glob Top passivation 26, so that the sensor chip and the electrical connection are completely enclosed. This results in increased mechanical protection and passivation, where the manufacture of the thin wall area 34 can be achieved for example by a 3-D printing method for construction of the sensor carrier 14. The underside 46 of the sensor carrier 14 is designed homogeneous, so that a continuous sliding layer for a sensor magnet can be provided.

Figure 5A:
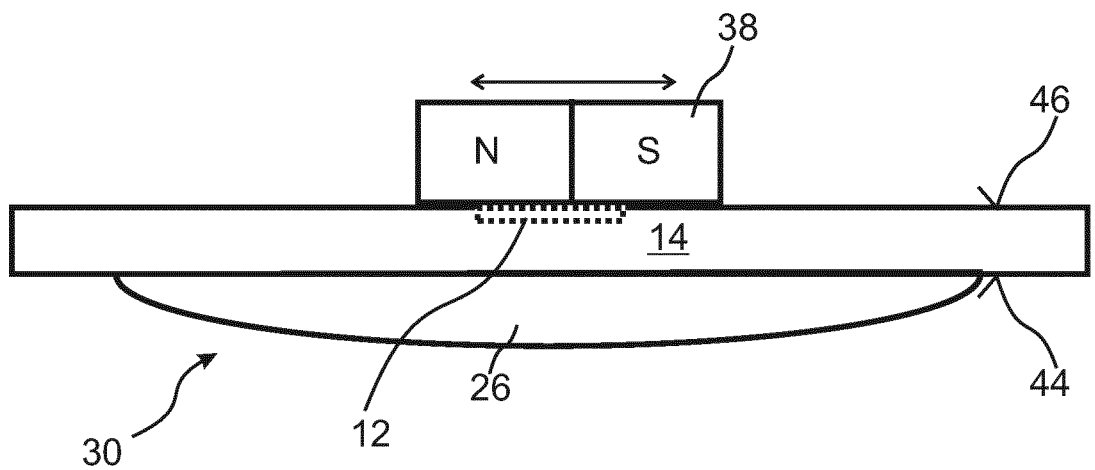
FIGS. 5a and 5b are views of an embodiment of a measuring method making use of various magnetic field sensors according to the invention.
Figure 5B:
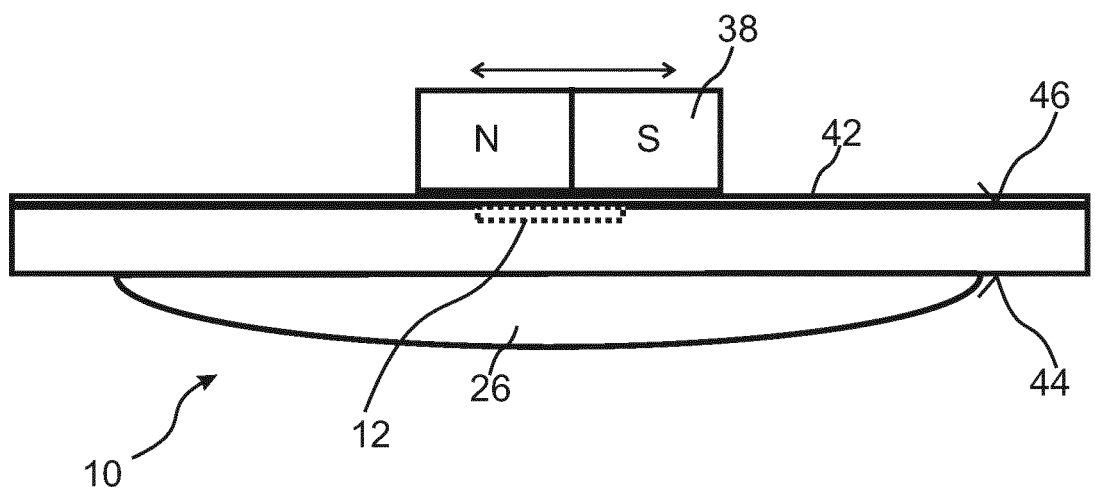

FIGS. 5a and 5b show an application of an example 30 or 10 for measurement of a linear movement of a sensor magnet 38. The sensor magnet 38 moves along the underside 46 of the sensor carrier. The sensor chip 12 is embedded in a recess or in a depression of the sensor carrier 14, and passivated. To do so, a passivation layer 26 for example on the upper side 44 of the sensor carrier 14, and facing away from the sensor magnet 38 during intended use, can be protected. The sensor magnet 38 moves in surface contact with the underside 46 of the sensor carrier 14, as shown in FIG. 5a. To reduce the friction resistance, a tribological protective layer 42, which can for example be provided by a carrier film 24, can be applied to the underside 46. This does increase the minimum distance between sensor magnet 38 and sensor chip 12, but can be formed in the range from 10 μm to 30 μm, improving the mechanical protection and reducing the friction effect, so that even very minor magnetic field fluctuations can be received by the sensor chip 12, and the sensor magnet 38 can be correspondingly small, compact and of low field strength.

The magnetic field sensor in accordance with the invention achieves an extremely reduced distance of the sensor magnet 38 to the sensor chip 12 that can be considerably less than 100 μm. The sensor magnet 38 moves here on the underside 46 of the sensor carrier 14. The chip thickness of the sensor chip 12 defines the lowest possible distance of the magnetoresistive resistor structures to the sensor magnet 38. Depending on requirements, the substrate of the sensor chip 12 can also be ground, i.e. abrasively reduced, to a reduced dimension to allow a required minimum distance of 30 μm to 100 μm to the magnetoresistive structures on the chip 12 to be achieved.

The advantage of the proposed magnetic field sensor is based on the fact that no substantial change in the layout of the sensor chip 12 or even of the enclosing sensor carrier 14 is necessary in existing sensor applications, and only the attachment depth of the sensor chip on the substrate carrier is changed. Standard chips can be used as sensor chips 12, and the existing chip-on-board technology can remain in use to allow the chip 12 to be electrically connected to the substrate carrier 14. The sensor chip 12 is inserted deeper than or flush with the substrate carrier 14, but can also protrude out of the recess or depression on the upper side, where tribological sliding layers can be applied without any problem to the underside 46. The sensor magnet 38 can, during intended use, come into surface contact with the sensor chip 12 and yet ESD damage is largely ruled out, since there is no unwelcome electrical charging due to contact thanks to a plastic packaging layer.

REFERENCE NUMERAL LIST

10 First example of a magnetic field sensor
12 Sensor chip
14 Sensor carrier/PCB
16 Recess in sensor carrier
18 Depression in sensor carrier
20 Bond pad
22 Bonding wire
24 Carrier film
26 Protective jacket
28 Electronic component/evaluation device
30 Second example of a magnetic field sensor
32 Electronic component/evaluation device
34 Thin wall area of the sensor carrier
36 Deepened connection area in the sensor carrier
38 Sensor magnet
40 Third example of a magnetic field sensor
42 Tribological protective layer
44 Upper side of the sensor carrier
46 Underside of the sensor carrier
50 Fourth example of a magnetic field sensor

The invention claimed is:
1. A magnetic field sensor for measuring a variable magnetic field, comprising:
   a magnetoresistive sensor chip;
   a flat sensor carrier carrying the sensor chip and having an upper side and an underside, the upper side of the sensor carrier having a recess in the form of a penetration through the sensor carrier in which the sensor chip is arranged;

the sensor chip being electrically contactable from the upper side of the sensor carrier via connection points provided on the sensor chip, and the sensor chip receiving via the underside of the sensor carrier a magnetic field to be measured which is generated by a generating sensor magnet movable along the underside of the sensor carrier; and a protective jacket filling in and/or covering the recess in the sensor carrier, the protective jacket having an ending flush with, or protruding above, the upper side of the sensor carrier for mechanical stabilization and passivation of the sensor chip;

wherein the sensor chip comprises a carrier substrate which ends flush with the underside of the sensor carrier in the recess, and the thickness of the carrier substrate is less than 100 µm.

2. The magnetic field sensor according to claim 1, wherein the sensor chip is positioned on and fastened to the sensor carrier from the upper side.

3. The magnetic field sensor according to claim 1, wherein the underside of the sensor carrier is coated with a carrier film and/or with a tribological protective layer.

4. The magnetic field sensor according to claim 1, wherein the recess is step-like and has a deepened connection area with bond pads.

5. The magnetic field sensor according to claim 4, wherein bonding wires are laid inside the recess such that they do not protrude above the upper side of the sensor carrier.

6. The magnetic field sensor according to claim 1, wherein the thickness of the carrier substrate is less than 50 µm.

7. The magnetic field sensor according to claim 1, wherein a tribological protective layer is applied as mechanical protection to the underside of the sensor carrier.

8. The magnetic field sensor according to claim 1, wherein the thickness of the carrier substrate is less than 30 µm.

9. A manufacturing method for manufacturing a magnetic field sensor having;
a magnetoresistive sensor chip;
a flat sensor carrier carrying the sensor chip and having an upper side and an underside, the upper side of the sensor carrier having a recess in the form of a penetration through the sensor carrier in which the sensor chip is arranged;
the sensor chip being electrically contactable from the upper side of the sensor carrier via connection points provided on the sensor chip, and the sensor chip receiving via the underside of the sensor carrier a magnetic field to be measured which is generated by a generating sensor magnet movable along the underside of the sensor carrier; and
a protective jacket filling in and/or covering the recess in the sensor carrier, the protective jacket having an ending flush with, or protruding above, the upper side of the sensor carrier for mechanical stabilization and passivation of the sensor chip,
the method comprising:
creating the recess in the form of the penetration through the sensor carrier extending from the upper side of the sensor carrier towards the underside of the sensor carrier;
at least temporary fastening the sensor chip in the recess in the area of the underside of the sensor carrier by positioning and fixing the sensor chip on to a carrier film that is at least temporarily attached to the underside of the sensor carrier;
bonding the sensor chip to bond pads of the sensor carrier; and filling in and/or covering of the recess with the protective jacket for mechanical stabilization and passivation of the sensor chip, the protective jacket being either flush with the upper side of the sensor carrier or protruding in the overlapping manner beyond the recess of the sensor carrier.

10. The manufacturing method according to claim 9, further comprising grinding down a carrier substrate of the sensor chip to a substrate thickness of less than 100 µm, or less than 50 µm, or less than 30 µm.

11. The manufacturing method according to claim 9, further comprising applying a tribological protective layer to the underside of the sensor carrier.

12. The manufacturing method according to claim 9, further comprising grinding flat the underside of the sensor carrier at least in an area around the recess after embedding of the sensor chip.

13. The manufacturing method according to claim 9, wherein the recess in the carrier substrate is step-like in order to provide a deepened connection area on which bond pads are arranged.

14. The manufacturing method according to claim 13, further comprising laying bonding wires inside the recess during bonding such that the bonding wires do not protrude above the upper side of the sensor carrier.

15. A measuring method comprising:
providing a magnetic field sensor according to claim 1;
moving a sensor magnet along the underside of the sensor carrier; and
processing and/or evaluating measurement signals of the sensor chip by an evaluation device arranged on the upper side of the sensor carrier.

16. A manufacturing method for manufacturing a magnetic field sensor having;
a magnetoresistive sensor chip;
a flat sensor carrier carrying the sensor chip and having an upper side and an underside, the upper side of the sensor carrier having a recess in the form of a penetration through the sensor carrier in which the sensor chip is arranged;
the sensor chip being electrically contactable from the upper side of the sensor carrier via connection points provided on the sensor chip, and the sensor chip receiving via the underside of the sensor carrier a magnetic field to be measured which is generated by a generating sensor magnet movable along the underside of the sensor carrier; and
a protective jacket filling in and/or covering the recess in the sensor carrier, the protective jacket having an ending flush with, or protruding above, the upper side of the sensor carrier for mechanical stabilization and passivation of the sensor chip;
the method comprising:
creating the recess in the form of the penetration through the sensor carrier extending from the upper side of the sensor carrier towards the underside of the sensor carrier;
at least temporary fastening the sensor chip in the recess in the area of the underside of the sensor carrier;
bonding the sensor chip to bond pads of the sensor carrier;
filling in and/or covering of the recess with the protective jacket for mechanical stabilization and passivation of the sensor chip, the protective jacket being either flush with the upper side of the sensor carrier or protruding in the overlapping manner beyond the recess of the sensor carrier; and grinding down a carrier substrate of the sensor chip to a substrate thickness of less than 100 μM.

17. The manufacturing method according to claim 16, wherein the grinding down step comprises grinding down the carrier substrate of the sensor chip to a substrate thickness of less than 50 μm.

18. The manufacturing method according to claim 16, wherein the grinding down step comprises grinding down the carrier substrate of the sensor chip to a substrate thickness of less than 30 μm.

19. A manufacturing method for manufacturing a magnetic field sensor having;
   a magnetoresistive sensor chip;
   a flat sensor carrier carrying the sensor chip and having an upper side and an underside, the upper side of the sensor carrier having a recess in the form of a penetration through the sensor carrier in which the sensor chip is arranged;
   the sensor chip being electrically contactable from the upper side of the sensor carrier via connection points provided on the sensor chip, and the sensor chip receiving via the underside of the sensor carrier a magnetic field to be measured which is generated by a generating sensor magnet movable along the underside of the sensor carrier; and
   a protective jacket filling in and/or covering the recess in the sensor carrier, the protective jacket having an ending flush with, or protruding above, the upper side of the sensor carrier for mechanical stabilization and passivation of the sensor chip;
the method comprising:
   creating the recess in the form of the penetration through the sensor carrier extending from the upper side of the sensor carrier towards the underside of the sensor carrier;
   at least temporary fastening the sensor chip in the recess in the area of the underside of the sensor carrier;
   bonding the sensor chip to bond pads of the sensor carrier;
   filling in and/or covering of the recess with the protective jacket for mechanical stabilization and passivation of the sensor chip, the protective jacket being either flush with the upper side of the sensor carrier or protruding in the overlapping manner beyond the recess of the sensor carrier; and
   grinding flat the underside of the sensor carrier at least in an area around the recess after embedding of the sensor chip.

\* \* \* \* \*